(12) United States Patent
Suga et al.

(10) Patent No.: US 6,573,635 B2
(45) Date of Patent: Jun. 3, 2003

(54) SURFACE ACOUSTIC WAVE DEVICE

(75) Inventors: Akira Suga, Nagano (JP); Masanori Ueda, Nagano (JP)

(73) Assignee: Fujitsu Media Devices Limited, Nagano (JP)

( * ) Notice: Subject to any disclaimer, the term of this patent is extended or adjusted under 35 U.S.C. 154(b) by 0 days.

(21) Appl. No.: 09/931,006

(22) Filed: Aug. 17, 2001

(65) Prior Publication Data

US 2002/0140322 A1 Oct. 3, 2002

(30) Foreign Application Priority Data

Mar. 30, 2001 (JP) ........................................ 2001-100061

(51) Int. Cl.[7] ............................................... H01L 41/08
(52) U.S. Cl. ................... 310/313 R; 310/344
(58) Field of Search ............................. 310/313 R, 344, 310/348, 340

(56) References Cited

U.S. PATENT DOCUMENTS 4,047,129 A * 9/1977 Ishiyama ................. 310/313 R
4,699,682 A * 10/1987 Takishima ............... 310/313 R
5,831,369 A * 11/1998 Furbacher et al. ....... 310/313 R
5,991,989 A * 11/1999 Onishi et al. ............ 310/313 R
6,310,420 B1 * 10/2001 Pahl et al. ............... 310/313 R

FOREIGN PATENT DOCUMENTS

JP          2000-261284          9/2000

* cited by examiner

*Primary Examiner*—Mark D. Budd
(74) *Attorney, Agent, or Firm*—Arent Fox Kintner Plotkin & Kahn, PLLC (57) ABSTRACT

Disclosed is a surface acoustic wave device comprising a piezoelectric substrate; an electrode unit formed on the piezoelectric substrate, the electrode unit including a drive electrode unit for generating surface acoustic waves and an external connection electrode unit; an electrically conductive electrode protecting unit for covering the drive electrode unit with a hollow therebetween, the electrode covering unit being formed on the piezoelectric substrate by use of a film forming technique; an electroconductive column formed on the external connection electrode unit; and an external connection terminal formed at the extremity of the electroconductive column, wherein the piezoelectric substrate is sealed by a resin with the exception of the external connection terminal and the electrode protecting unit.

5 Claims, 10 Drawing Sheets

SURFACE ACOUSTIC WAVE DEVICE

BACKGROUND OF THE INVENTION

1. Field of the Invention

The present invention relates generally to a surface acoustic wave (SAW) device, and, more particularly, to a surface acoustic wave device enabling packaging to be effected in a wafer process.

2. Description of the Related Art

Mobile communication equipment such as cellular phones and cordless telephones is rapidly prevailing with recent progress toward miniaturization and lightness of electronic devices. A high frequency circuit of a radio communication circuit included in such mobile communication equipment uses a multiplicity of electronic devices mounted with filter elements.

Figure 1:
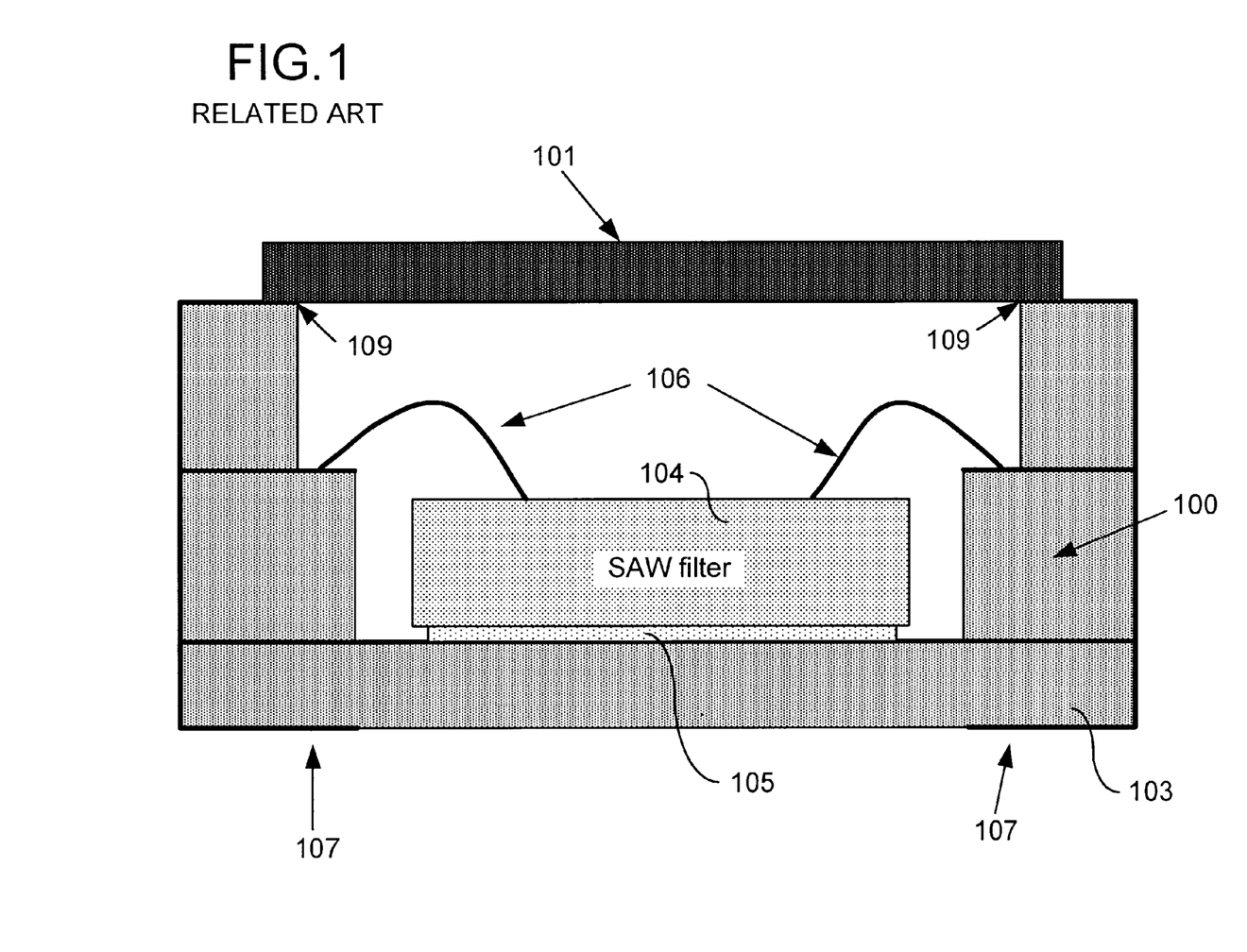
FIG. 1 is a schematic view showing in section a conventional surface acoustic wave device having a surface acoustic wave element, and its wiring connection structure for connecting the surface acoustic wave element to an external connection terminal.

For the purpose of realizing the miniaturization and lightness in particular, surface acoustic wave (SAW) elements are employed as the filter elements. FIG. 1 is a schematic diagram showing in section a conventional surface acoustic wave device having a surface acoustic wave element, and its wiring connection structure for connecting the surface acoustic wave element to external connection terminals.

A package for the surface acoustic wave device is constructed from a multilayer ceramic package 100 and a metal cap 101. The surface acoustic wave element 104 is adhered by an electroconductive resin 105 to the top of a substrate 103 disposed within the interior of the package, with input and output terminals of the surface acoustic wave element 104 being electrically connected via aluminum wires 106 to a ground terminal. The reverse side of the substrate 103 is formed with an external connection terminal 107.

Figure 2:
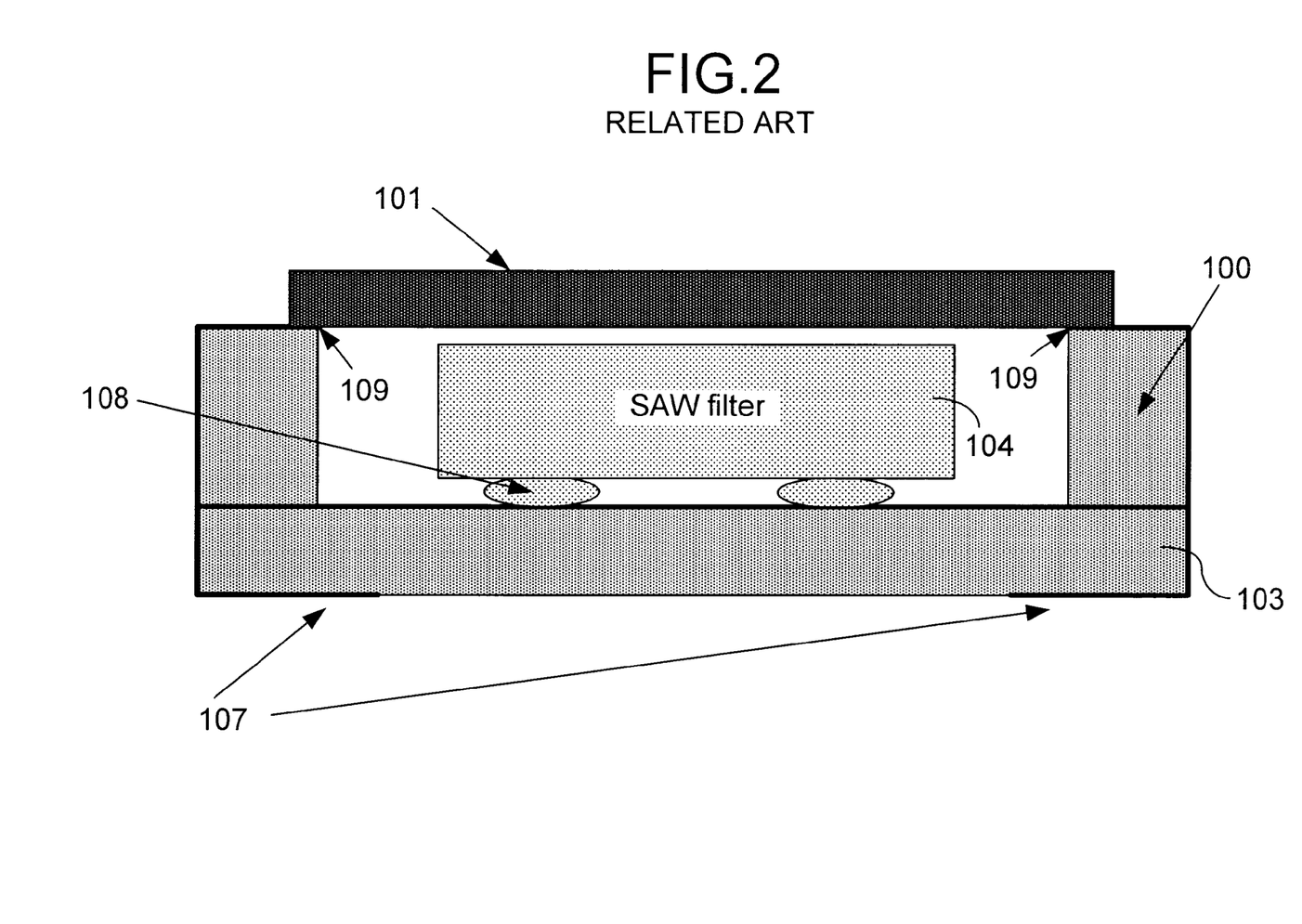
FIG. 2 is a diagram showing the configuration of another conventional surface acoustic wave device, depicting the features of physical fixation by flip-chip bonding and of electrical connection wiring.

FIG. 2 shows the structure of another conventional surface acoustic wave device, in which the surface acoustic wave element 104 is connected by connection bumps 108 to the substrate 103 disposed on the bottom of the package, to provide physical fixation and electrical connection wiring.

Thus, in the structure shown in FIGS. 1 and 2, electric wirings (the aluminum wires 106 in FIG. 1 and the connection bumps 108 in FIG. 2) are both formed within the interior of the ceramic package 100.

The cap 101 has a sealing material 109 formed in a region in contact with the ceramic package 100. This provides a hermetic sealing between the ceramic package 100 and the cap 101 so that airtightness is held within the interior of the package.

Thus, to achieve a miniaturization of the surface acoustic wave device, the structure shown in FIGS. 1 and 2 can not neglect the space which is used for the aluminum wire connection and the hermetic sealing structure between the package 100 and the cap 101.

The manufacturing procedure includes making electrode wiring on a piezoelectric substrate wafer by patterning and thereafter cutting and separating the wafer into chip elements to thereby obtain individual surface acoustic wave (SAW) elements 104.

The cut chip elements are mounted on the package 100, which is then fitted with the cap 101 for sealing to obtain a surface acoustic wave device. For this reason, the cost of the cap 101 is a factor greatly affecting the price of product of the surface acoustic wave device. On the contrary, another technique is also known where the package is formed in the state of a wafer (Japan Patent Laid-open Pub. No. 2000-261285).

In the technique described in Japan Patent Laid-open Pub. No.2000-261285, electrodes are formed on a piezoelectric substrate wafer by patterning and a cover forming member is formed from a separate and independent substrate wafer. The cover forming member is then laminated to the piezoelectric substrate wafer having the electrodes formed thereon by patterning, to thereby obtain a surface acoustic wave device having a surface acoustic wave element function.

However, such a technique disclosed in the above patent laid-open publication also imposes a limitation on miniaturization of the surface acoustic wave device and needs a separate provision of the cover forming member, which may be disadvantageous in the number of manufacturing steps. This leads to increase the price of the device.

SUMMARY OF THE INVENTION

The present invention was conceived in view of the problems involved in the prior art. It is therefore an object of the present invention to provide a lightweight and chip-sized surface acoustic wave device.

It is another object to provide a surface acoustic wave device capable of being manufactured up to packaging in the state of a piezoelectric substrate wafer by a less number of steps.

In order to achieve the above objects, according to a first aspect of the present invention there is provided a surface acoustic wave device comprising a piezoelectric substrate; a drive electrode unit formed on the piezoelectric substrate, for generating surface acoustic waves; and an electrically conductive electrode protecting unit for covering the drive electrode unit with a hollow therebetween, wherein the electrode protecting unit is formed on the piezoelectric substrate by use of a film forming technique.

In order to achieve the above objects, according to a second aspect of the present invention there is provided a surface acoustic wave device comprising a piezoelectric substrate; an electrode unit formed on the piezoelectric substrate, the electrode unit including a drive electrode unit for generating surface acoustic waves and an external connection electrode unit; an electrically conductive electrode protecting unit for covering the drive electrode unit with a hollow therebetween, the electrode protecting unit being formed on the piezoelectric substrate by use of a film forming technique; an electroconductive column formed on the external connection electrode unit; and an external connection terminal formed at the extremity of the electroconductive column, wherein the piezoelectric substrate is sealed by a resin with the exception of the external connection terminal and the electrode protecting unit.

In order to achieve the above objects, according to a third aspect of the present invention there is provided a method of manufacturing a surface acoustic wave device, comprising the steps of forming a drive electrode having a surface acoustic wave element function on a piezoelectric substrate wafer; resist coating an upper region of the drive electrode; effecting a metal film coating in dome form so as to cover the resist coat; removing the resist lying within the metal dome coated; and providing a resin seal thereon.

BRIEF DESCRIPTION OF THE DRAWINGS

The above and other objects, aspects, features and advantages of the present invention will become more apparent from the following detailed description of the preferred embodiment when read in conjunction with the accompanying drawings, in which.

DESCRIPTION OF THE PREFERRED EMBODIMENT

Figure 3:
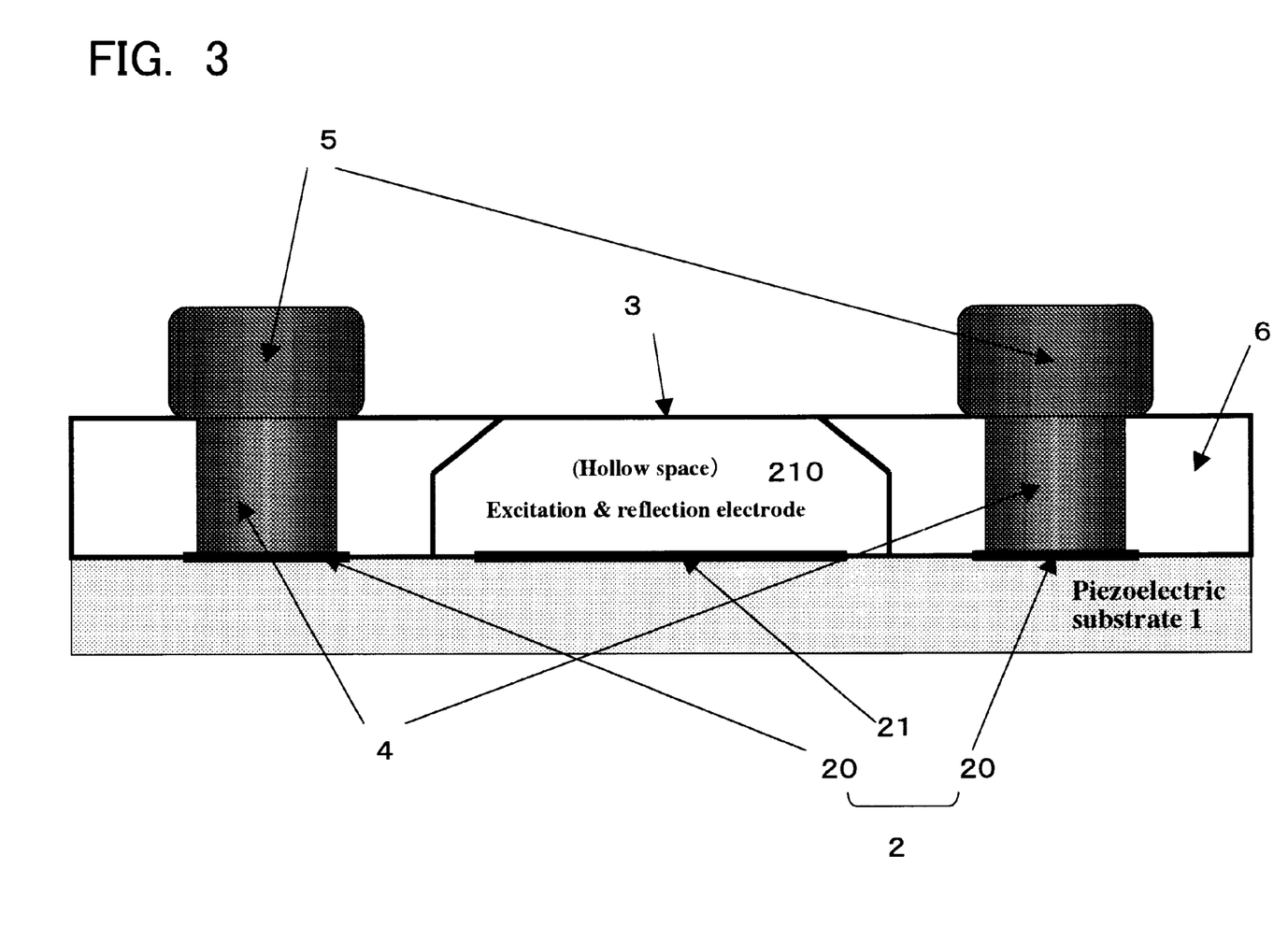
FIG. 3 is a sectional view showing the schematic structure of a surface acoustic wave device having a surface acoustic wave (SAW) element function in accordance with the present invention.

FIG. 3 is a sectional view showing the schematic structure of a surface acoustic wave device having a surface acoustic wave (SAW) element function in accordance with the present invention.

Referring to FIG. 3, an electrode unit 2 formed on a piezoelectric substrate 1 comprises external connection electrode units 20 electrically connected to external connection terminals 5 for signal path, and a drive electrode unit 21 having an excitation and reflection electrode acting as a surface acoustic wave (SAW) element function unit.

As one feature, in order to hold the airtightness, a dome-shaped electrode protecting unit 3 provides a hollowness for the top surface of the drive electrode unit 21 having the excitation and reflection electrode acting as the surface acoustic wave (SAW) element function unit.

The external connection electrode unit 20 acts as an electrode pad and has, on its top surface, a metal column 4 connected to the external connection terminals 5. The end surface of each metal column 4 is formed with the external connection terminal 5 made of a metal bonding material such as lead free solder. Furthermore, with the exception of the surface of the electrode protecting unit 3 and the portion of the external connection terminal 5, a resin seal 6 is provided.

By virtue of the electrode protecting unit 3, it is possible to hold the airtightness above the drive electrode unit 21 for excitation and reflection to thereby secure the reliability of the surface acoustic wave device.

Such a characteristic structure of the present invention eliminates the need for the cap and packaging and allows the surface acoustic wave device to be formed in the state of a piezoelectric substrate wafer.

Figure 4:
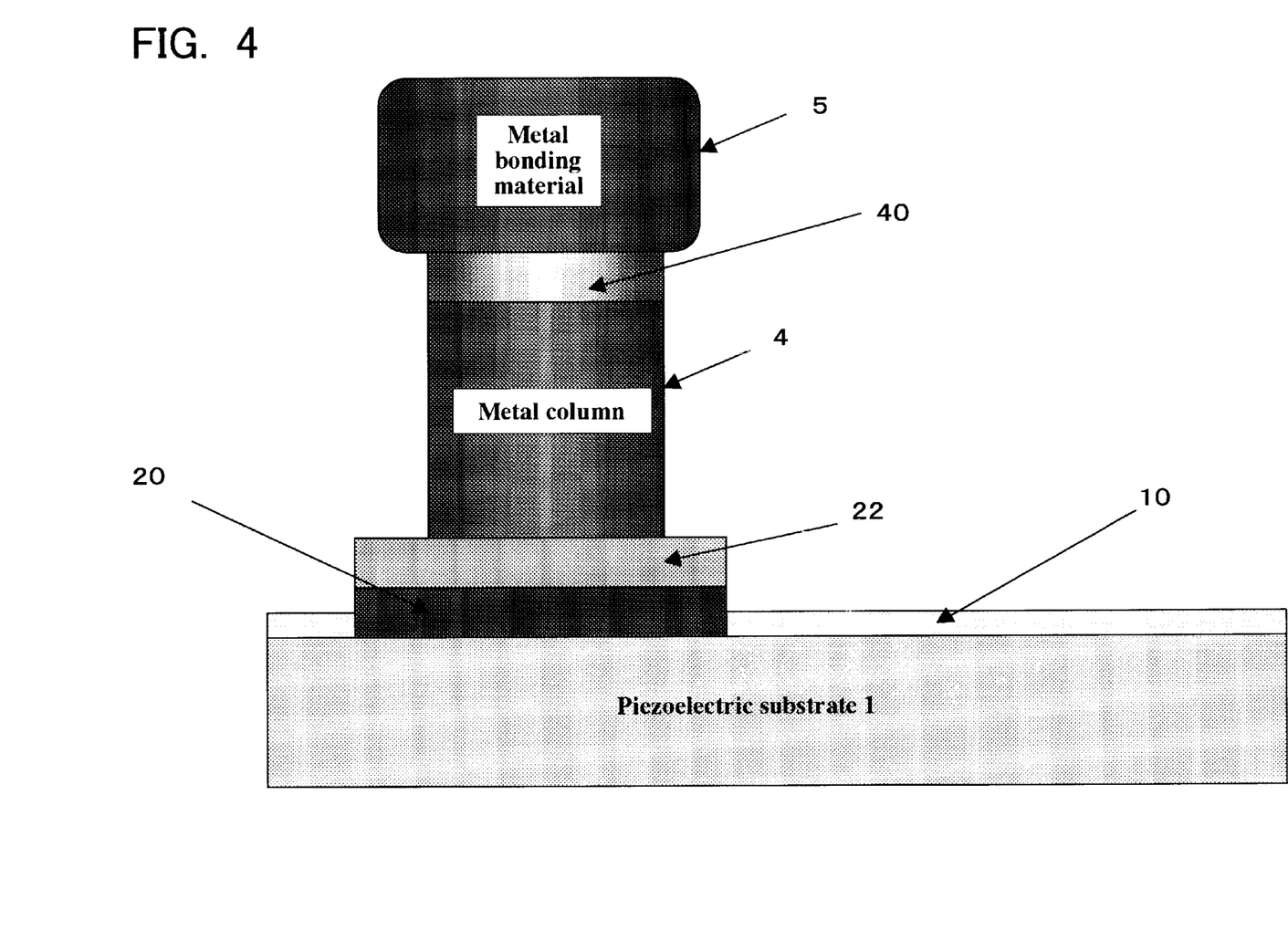
FIG. 4 is a diagram showing the details of a connection terminal structure unit for signal path of FIG. 3.

FIG. 4 shows the details of a connection terminal structure unit for signal path of FIG. 3. An electrically conductive layer 22 is formed on top of the external connection electrode unit 20 to increase the bonding strength between the external connection electrode unit 20 and the metal column 4.

Furthermore, due to the provision of an electrically conductive intermediate layer 40 between the end surface of the metal column 4 and the end surface of the external connection terminal 5 made of a metal bonding material; it is possible to prevent the diffusion of components of the metal column 4 into the external connection terminal 5 made of the metal bonding material. These contribute to enhancement of the reliability of the surface acoustic wave device.

Figure 5:
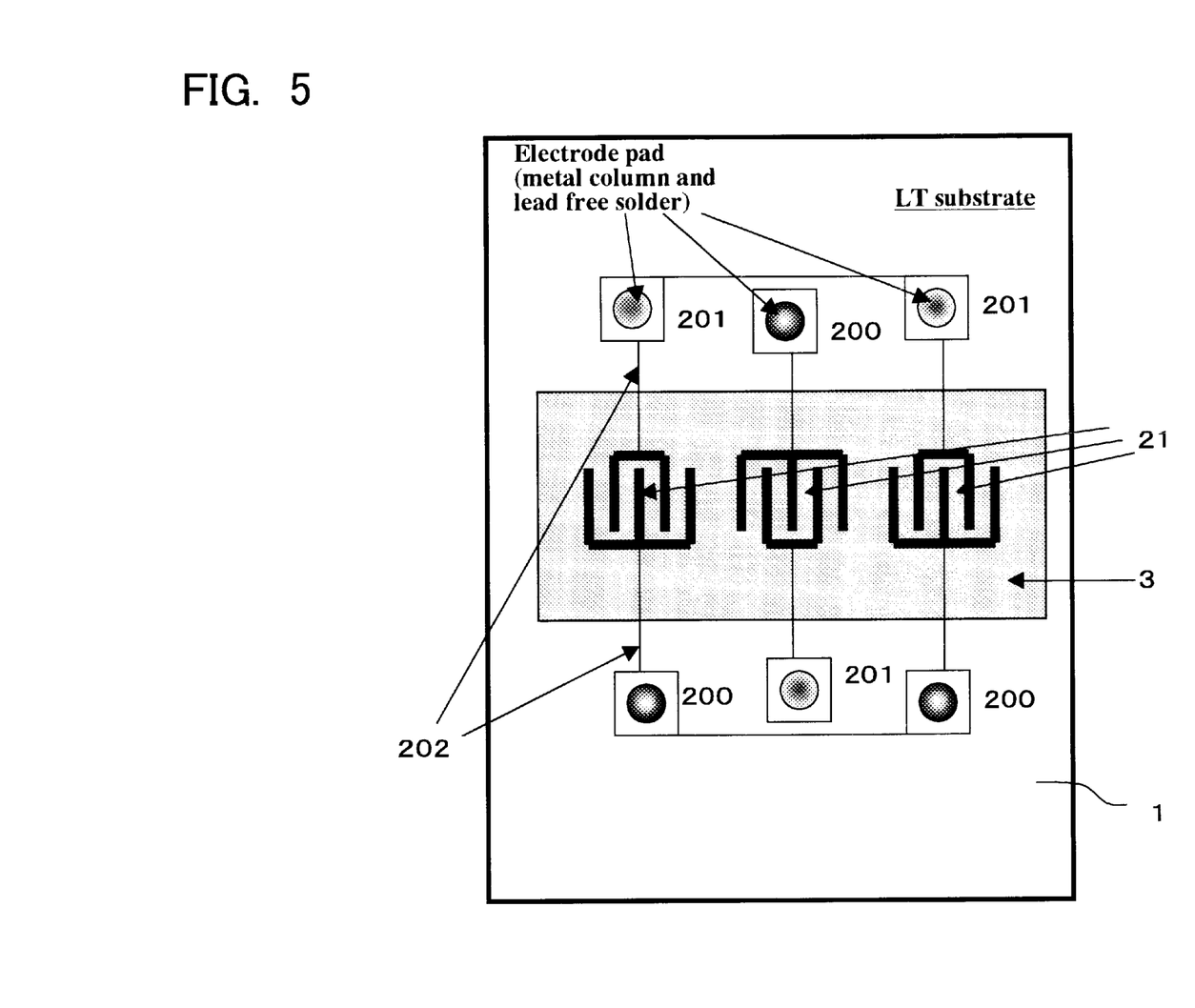
FIG. 5 is a top plan view of an embodiment of the surface acoustic wave device having a surface acoustic wave (SAW) element filter formed thereon in accordance with the present invention.
Figure 6:
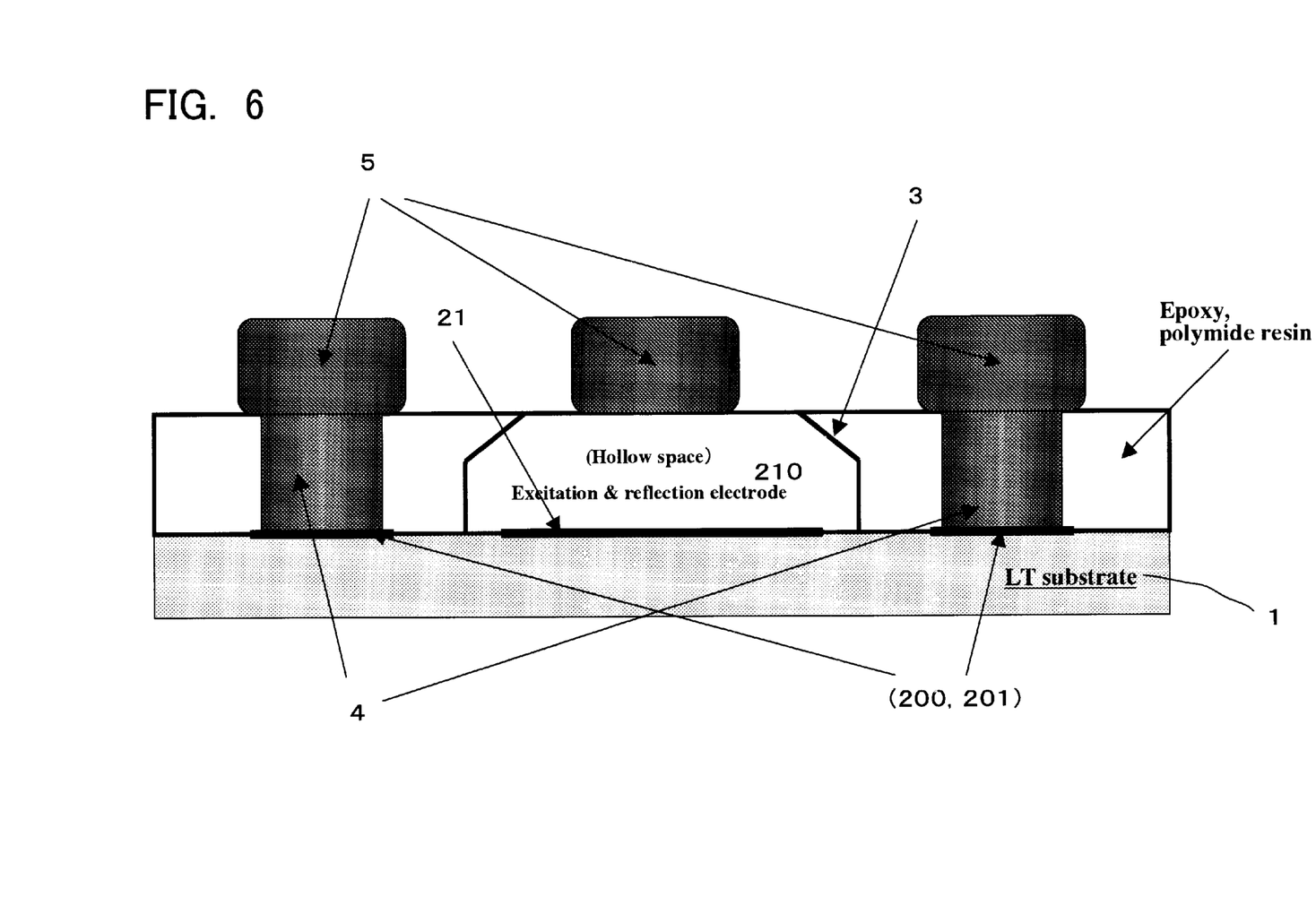
FIG. 6 is a sectional view of the surface acoustic wave element when viewed from below in FIG. 5.

FIGS. 5 and 6 show an embodiment of the present invention. FIG. 5 is a top plan view of the embodiment of a surface acoustic wave device having a surface acoustic wave (SAW) element filter in accordance with the present invention. FIG. 6 is a sectional view of the surface acoustic wave device when viewed from below of FIG. 5.

A $LiTaO_3$ single crystal substrate (hereinafter referred to as an LT substrate 1) is used as the piezoelectric substrate 1 of the surface acoustic wave device shown in FIGS. 5 and 6. Besides the $LiTaO_3$ single crystal substrate, substrate materials such as $LiNbO_3$ single crystal and quartz having a piezoelectric effect are available for the piezoelectric substrate.

Drive electrode units 21, signal line connection electrode pads 200 and ground connection electrode pads 201 as the external connection electrode units 20 are formed on the LT substrate 1, each electrode pad being made mainly of Al. Al wiring patterns 202 connect each electrode pad of the signal line connection electrode pads 200 and the ground connection electrode pads 201, and corresponding one of the drive electrode units 21.

To obtain appropriate filter characteristics, a hollow space needs to be formed above the drive electrode unit 21 for excitation and reflection. For this reason, in the present invention, a metal dome 3 is formed on the drive electrode unit 21 to secure a hollow space 210. In the embodiment, the metal dome 3 is formed by use of a film forming technique such as plating, sputtering or vapor deposition with Cu or with a material mainly containing Cu.

The metal dome 3 is connected to any ground wiring pattern so that the entire metal dome is at the ground potential.

Figure 7:
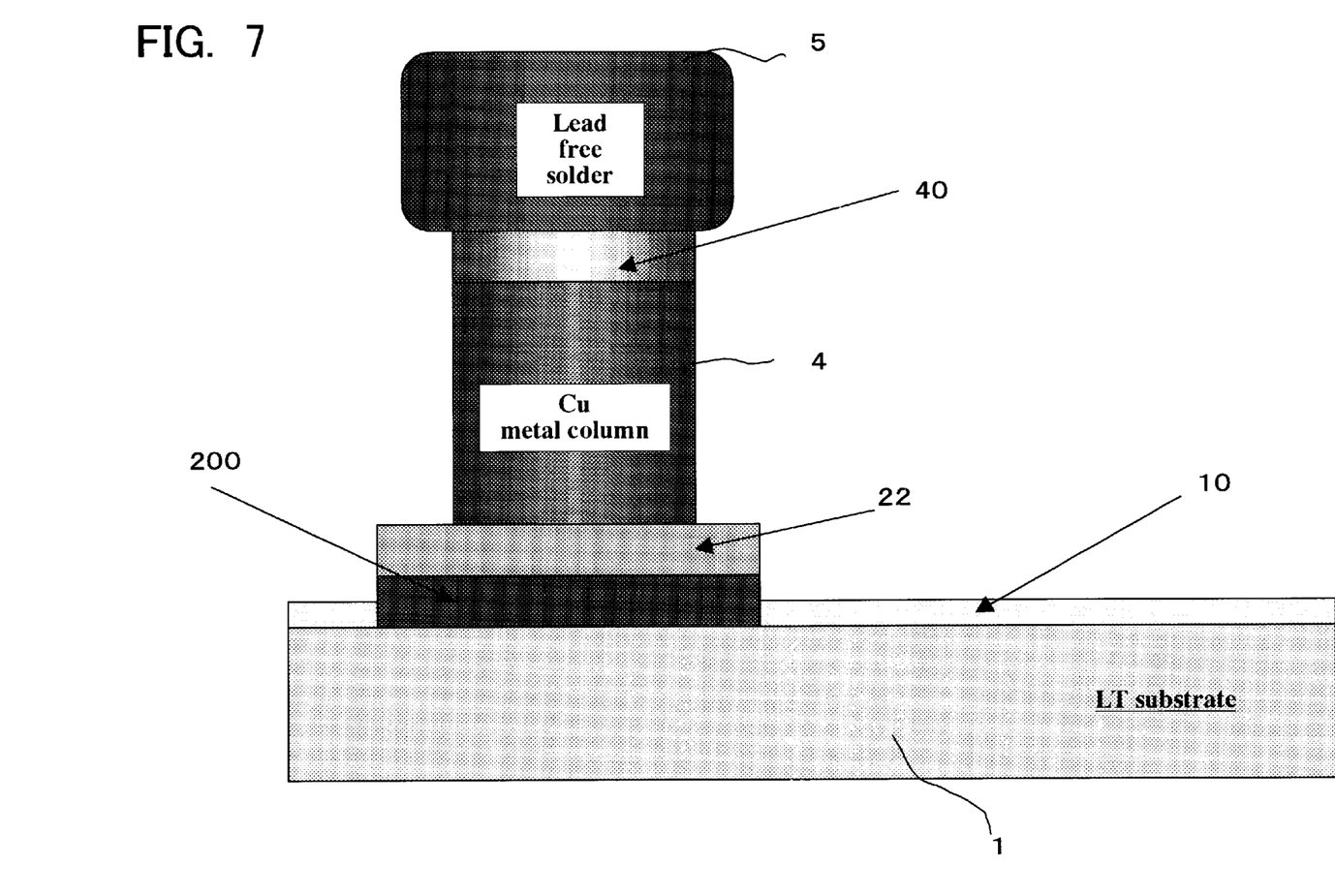
FIG. 7 shows the structure of a detailed example of an external connection electrode pad 200 of FIG. 6.

FIG. 7 shows the structure of a detailed example of the external connection electrode pad 200 of FIG. 6. The ground electrode pad 201 being similar in structure to the input/output electrode pad 200, only the input/output electrode pad 200 is visible in FIG. 7.

An insulating intermediate layer 10 formed on the LT substrate 1 in FIG. 4 is formed from an $SiO_2$ insulating film.

The signal line connection electrode pads 200 and the ground connection electrode pads 201 are made of an Al-containing metal by patterning the $SiO_2$ insulating film acting as the intermediate layer 10. A Ti film is further formed as an electrically conductive layer 22 on top of the Al-containing signal line-connection electrode pads 200 by vapor deposition or sputtering.

The metal column 4 made mainly of Cu is formed on top of the electrically conductive intermediate layer 22. The Ti film layer of the electrically conductive intermediate layer 22 contributes to an enhancement of the intimate adhesion between the signal line connection electrode pad 200 and the metal column 4.

After the formation of the metal column 4, an Sn film is formed as the electrically conductive intermediate layer 40 on the end surface of the metal column 4 by plating, vapor deposition, sputtering or the like. The Sn film prevents Cu component of the metal column 4 from diffusing into the external connection terminal 5 formed from lead free solder as a metal bonding material.

In the embodiment shown in FIG. 6, the surface of the metal dome 3 is also formed with the external connection terminal 5 made of lead free solder as a metal bonding material. Accordingly, an Sn film may be formed as the electrically conductive intermediate layer 40 on top of the metal dome 3.

With the exception of the external connection terminals 5 made of the lead free solder as the metal bonding material and the metal domes 3, the surface of the LT substrate 1 is coated with epoxy resin, polyimide resin or the like for hardening. p The details of the metal dome 3 will then be described with reference to FIGS. 8A to 8C as well as FIGS. 9A to 9H which illustrate formation steps of the surface acoustic wave device.

Figure 8A:
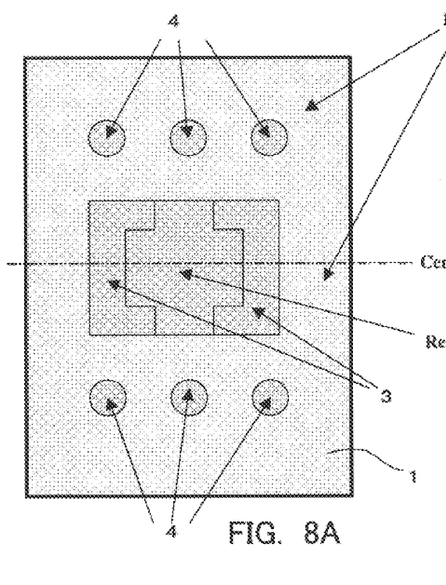
FIGS. 8A to 8C are diagrams explaining the details of a metal dome 3.

FIG. 8A is a schematic diagram showing the arrangement pattern of the metal columns 4 and the position of formation of the metal dome 3 when perspectively viewing from top of the surface acoustic wave device having the surface acoustic wave (SAW) element function.

Description will now be made with reference to FIGS. 9A to 9H. A resist A is coated on the LT substrate 1 which is a piezoelectric substrate wafer (processing step FIG. 9A). FIGS. 9A to 9H show only a single surface acoustic wave device portion cut from the piezoelectric substrate wafer on a chip-to-chip basis.

Figure 9A:
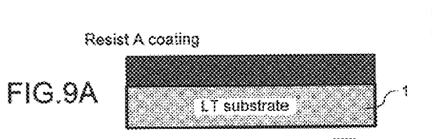
FIGS. 9A to 9H are diagrams showing the step of forming the surface acoustic wave device.

Although previous to the processing step FIG. 9A, the drive electrode unit 21 making up the surface acoustic wave element function unit and the external connection electrode unit 20 connected to the external connection terminal 5 are formed by patterning on the LT substrate 1, these electrode units are regarded as being already formed and the steps therefor are not shown.

Figure 9B:
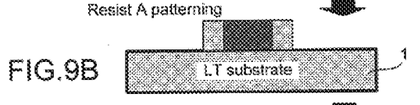

Patterning is then made in such a manner as to leave the region corresponding to the hollow space 210 of the metal dome 3, and the resist A is removed (processing step FIG. 9B).

Figure 9C:
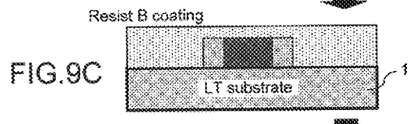

A resist B is then coated to a height which is level with the top surface of the metal dome 3 (processing step FIG. 9C). Thus, in terms of the resist films formed as shown in FIG. 9C, the resist A film corresponding to the hollow forming portion 210 (see FIG. 6) of the metal dome 3 is formed so as to be thinner than the resist B film formed around the metal dome 3.

Figure 9D:
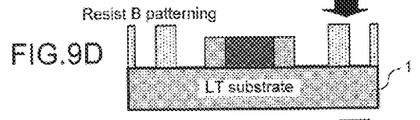

Afterward, the resist B lying within the regions corresponding to the metal column 4 and the metal dome 3 is removed by patterning (processing step FIG. 9D).

Figure 8B:
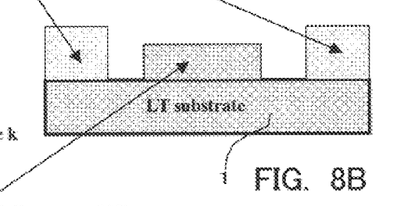

FIG. 8B is a sectional view taken along a center line k of FIG. 8A. FIG. 8B, a schematic view corresponding to FIGS. 9A to 9H, shows the resist A and B films which are formed with the exception of the region where the metal dome 3 is formed. In FIG. 8B, the patterning of the metal column 4 portion is not shown.

Figure 9E:
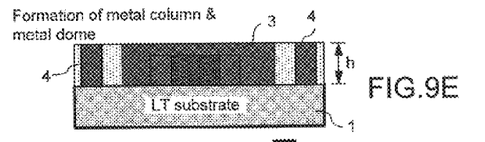
Figure 9F:
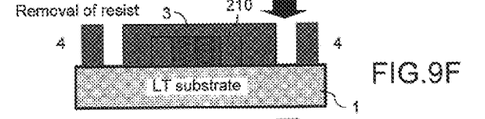
Figure 9G:
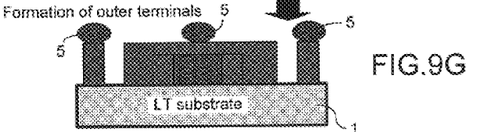

Then, with the resist A film and the resist B film formed, a Cu film is formed to a thickness h of 100 μm by electrolytic plating to form the metal column 4 and the metal dome 3 (processing step FIG. 9E). A current-feed terminal for electrolytic plating is not shown. Electroless plating may be effected.

Figure 8C:
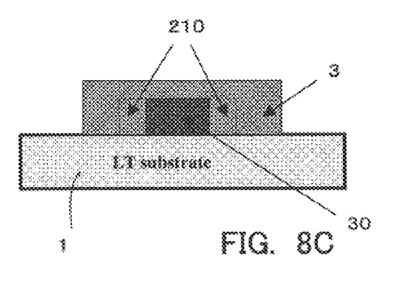
Figure 9H:
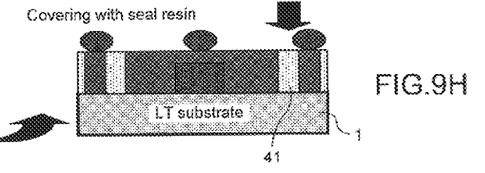

The resist B film is then removed and the resist A film corresponding to the hollow space 210 covered by the metal dome 3 is removed from an outlet for resist 30 (processing step FIG. 9H). This allows the hollow space 210 to be formed within the interior of the metal dome 3 as shown in FIG. 8C.

The order of removal of the resist B film around the metal dome and the resist A film within the hollow space 210 is as follows. The resist B film is first removed, and then the resist A film is removed from the outlet for resist 30 by using a solvent. The removal of the resist A film and B film may be effective in a consecutive manner.

In FIGS. 8A to 8C, the outlet for resist 30 is disposed at the top and bottom (in FIG. 8A), which is shown in a simplified manner for the purpose of understanding.

More specifically, the outlet for resist 30 provided in the metal dome 3 portion is arranged such that it lies on the input/output signal line (the aluminum wiring pattern 202 of FIG. 5) connecting the electrode pattern of the metal column 4 and the drive electrode 21 covered by the metal dome 3. This obviates any contact of the metal dome 3 with the input/output signal line. Accordingly, in the example of FIG. 5, the outlet for resist 30 is provided at three locations of the top and of the bottom corresponding to the aluminum wiring pattern.

Returning to FIGS. 9A to 9H, lead free solder (Sn—Ag—Cu) is fused to the extremity of the metal column 4 formed simultaneously with the metal dome 3, to form the external connection terminal 5 (processing step FIG. 9G). With the exception of the external connection terminal 5 and the metal dome 3, the surface is formed with [are then removed to effect] the resin sealing (processing step FIG. 9H).

As a result, an electronic device having a surface acoustic wave (SAW) element formed thereon is obtained.

Although FIGS. 9A to 9H show the manufacturing steps of the surface acoustic wave device in the form of a single chip for the purpose of simplification as described above, a plurality of chips are typically formed on the LT substrate 1 like the piezoelectric substrate wafer, and at the final stage of the process it is cut and separated into chips to obtain individual surface acoustic wave devices.

Figure 10:
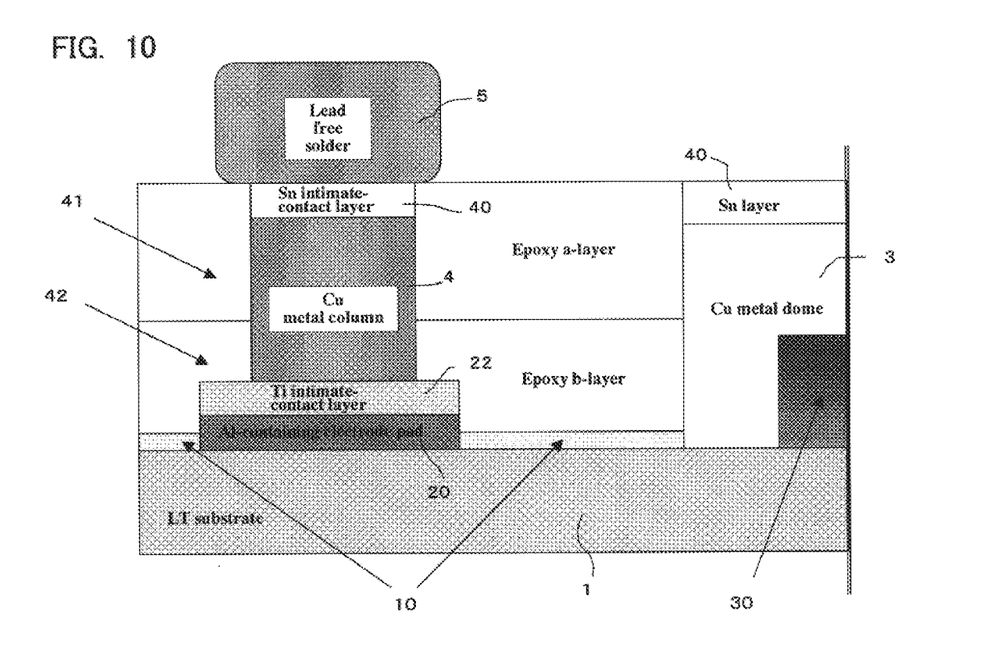
FIG. 10 is a diagram showing the detailed structure of a processing step (FIG. 9H) for a resin seal 41, in addition to the metal dome 3 and a metal column 4 formed in the step of FIGS. 8A to 8C.

FIG. 10 is a diagram further showing the detailed structure of the processing step of the resin sealing 41 on the metal dome 3 in FIG. 9H and the metal column 4 formed by the steps shown in FIGS. 8A to 8C.

In the processing step of the resin sealing 41 in FIG. 9H, a layer of epoxy b42 is formed on top of the LT substrate 1 to seal off the outlet for resist 30. The layer of epoxy b42 covers the input/output signal line (aluminum wiring pattern 202) and enters the space defined between the line and metal dome 3 to improve the electrical insulating properties between the input/output signal line and the metal dome 3.

After hardening of the epoxy b42 layer, a layer of epoxy a41 is coated thereon up to a height which is level with the Cu metal column 4 and the metal dome 3, for hardening.

The conditions to be fulfilled between the sealing resin layers of the epoxy resin a41 and epoxy resin b42 is that the sealing resin layer of the epoxy b42 providing a lower layer has a shorter hardening time and higher viscosity than the sealing resin layer of the epoxy a41 providing an upper layer.

This is attributable to the need for the epoxy b42 to cover the outlet for resist 30 portion of the metal dome 3 but not to enter the interior of the hollow space upon the formation of the epoxy b42. For this reason, the epoxy resin b42 requires hardening in a shorter period of time and a high viscosity. It is also desirable upon the formation of the layer of the epoxy a41 to form an even layer. Thus, the above conditions are imposed to the relationship of the hardening speed and of the viscosity between the epoxy a41 and the epoxy b42.

The above layer of the epoxy b42 may directly be formed in the region of the outlet for resist 30 by only potting without being necessarily formed as a resin layer having an evenness.

The epoxy a41 and b42 may be replaced by other resin such as polyimide resin, with the need to keep the relations of the above hardening time and the viscosity.

Ultimately, the outlet for resist itself is sealed off by the polyimide resin or epoxy resin.

Referring finally to FIG. 10, an Sn intimate-contact layer 40 is formed between the external connection terminal 5 and the metal column 4 and on the metal dome 3, the layer 40 being formed in the processing step of FIG. 9E after the formation of a Cu thin film, by Sn vapor deposition, sputtering or the like by use of patterning of the resist B.

Although in the above embodiment a single surface acoustic wave device has a single surface acoustic wave element function unit by way of example, the application of the present invention is not limited thereto. It would equally be possible for the surface acoustic wave device to have a plurality of surface acoustic wave element function units and have separate metal domes 3 each corresponding to each surface acoustic wave element function unit. It would also be possible to provide a single common metal dome 3 for the plurality of surface acoustic wave element function unit.

As hereinabove set forth in the embodiment with reference to the drawings, the present invention eliminates not only the need for the space for wires but also the need for the cap and package itself, due to no need for the wire bonding. This enables the surface acoustic wave device to be created through only the piezoelectric substrate wafer processing steps, which advantageously leads to a lowering of the costs.

In addition, implementation of the chip-size packaging on a wafer basis allows the provision of the low-priced, light-weight and small-sized surface acoustic wave devices.

What is claimed is:

1. A surface acoustic wave device comprising:

a piezoelectric substrate;

an electrode unit formed on the piezoelectric substrate, the electrode unit including a drive electrode unit for generating surface acoustic waves and an external connection electrode unit;

an electrically conductive electrode protecting unit for covering the drive electrode unit with a hollow therebetween, the electrode protecting unit being formed on the piezoelectric substrate by use of a film forming technique;

an electroconductive column formed on the external connection electrode unit; and an external connection terminal formed at the extremity of the electroconductive column, wherein
the piezoelectric substrate is sealed by a resin with the exception of the external connection terminal and the electrode protecting unit.

2. The surface acoustic wave device according to claim 1, further comprising an external connection terminal electrically connected to the surface of the electrode protecting unit.

3. The surface acoustic wave device according to claim 1, further comprising an intermediate layer interposed between the electroconductive column and the external connection electrode unit and between the electroconductive column and the external connection terminal.

4. The surface acoustic wave device according to claim 1, wherein the piezoelectric substrate is made of $LiTaO_3$ single crystal.

5. The surface acoustic wave device according to claim 1, wherein the piezoelectric substrate is made of $LiNbO_3$ single crystal.

* * * * *